(12) United States Patent
Jo

(10) Patent No.: US 7,365,017 B2
(45) Date of Patent: Apr. 29, 2008

(54) METHOD FOR FINISHING METAL LINE FOR SEMICONDUCTOR DEVICE

(75) Inventor: Bo Yeoun Jo, Gimpo (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/183,093

(22) Filed: Jul. 14, 2005

(65) Prior Publication Data
US 2006/0014373 A1 Jan. 19, 2006

(30) Foreign Application Priority Data
Jul. 16, 2004 (KR) .................... 10-2004-0055548

(51) Int. Cl.
*H01L 21/302* (2006.01)

(52) U.S. Cl. ............... 438/710; 438/706; 438/707; 438/711; 438/714; 257/E21.245; 257/E21.246; 257/E21.311

(58) Field of Classification Search .......... 438/690, 438/694, 706, 710, 725, 707, 711, 714; 257/E21.245, 257/E21.311, E21.246
See application file for complete search history.

(56) References Cited

U.S. PATENT DOCUMENTS

| | | | | |
|---|---|---|---|---|
| 5,560,803 | A * | 10/1996 | Mihara et al. | 438/725 |
| 6,692,903 | B2 * | 2/2004 | Chen et al. | 430/329 |
| 2003/0207563 | A1 * | 11/2003 | Smith et al. | 438/637 |
| 2005/0224458 | A1 * | 10/2005 | Gaudet et al. | 216/67 |

* cited by examiner

*Primary Examiner*—Hsien-Ming Lee
*Assistant Examiner*—Su C. Kim
(74) *Attorney, Agent, or Firm*—Andrew D. Fortney

(57) ABSTRACT

A method for finishing a metal line for a semiconductor device is disclosed, in which polymer generated when forming the metal line including aluminum and its alloy is effectively removed and the metal line is prevented from being eroded. A chlorine radical and a chlorine compound remaining on a surface of the metal line are removed using $H_2O$ plasma and the polymer is removed using $H_2O$ gas and HF gas not plasma. Therefore, it is possible to improve reliability and yield of the semiconductor device.

28 Claims, 4 Drawing Sheets

METHOD FOR FINISHING METAL LINE FOR SEMICONDUCTOR DEVICE

This application claims the benefit of Korean Application No. 10-2004-0055548 filed on Jul. 16, 2004, which is hereby incorporated by reference as if fully set forth herein.

BACKGROUND OF THE INVENTION

1. Field of the Invention

The present invention relates to a method for finishing a metal line for a semiconductor device, and more particularly, to a method for finishing a metal line for a semiconductor device in which a chlorine radical and a chlorine compound generated when forming a metal line for a semiconductor device including aluminum and its alloy are removed using $H_2O$ plasma to prevent the metal line from being eroded and a polymer generated when forming the metal line is effectively removed using $H_2O$ gas and HF gas to improve reliability and yield of the semiconductor device.

2. Discussion of the Related Art

Recently, with rapid development of information media such as computers, the manufacture technology of a semiconductor device has been developed rapidly. The technology of the semiconductor device is being developed in such a way that its integration, miniaturization, and operational speed are improved.

Aluminum or its alloy having excellent electric conductivity and low cost is widely used as a material of a metal line for a high integrated circuit such as a very large-scale integrated (VLSI) circuit.

Generally, the process of forming a metal line of aluminum includes the steps of forming an aluminum film, coating a photoresist on the aluminum film and patterning it, etching the aluminum film exposed without being covered with the photoresist using plasma including a chlorine radical, and stripping the photoresist.

FIG. 1A to FIG. 1C are sectional views illustrating a related art method for finishing a metal line for a semiconductor device.

First, as shown in FIG. 1A, a photoresist 110 is coated on a substrate 100 on which an oxide film 102, a barrier film 104, an aluminum film 106 and an antireflective coating film 108 are sequentially formed. The photoresist 110 is then patterned so that the aluminum film 106 is dry-etched by plasma including chlorine using the patterned photoresist 110 as a mask. At this time, chlorine is reacted with the aluminum film 106 and the photoresist 110 to form a polymer 112 containing chlorine. The polymer 112 is coated on a surface of the aluminum film 105.

Next, as shown in FIG. 1B, a strip process is performed to remove the photoresist 110. When the photoresist 110 is removed, the polymer 112 is partially removed but still remains on the surface of the aluminum film 106. If the polymer 112 is exposed to the air, $H_2O$ in the air is reacted with chlorine to form hydrogen chloride (HCl). The hydrogen chloride erodes the aluminum film 106 to degrade electrical characteristics of the semiconductor device or cause a defect such as short in a serious case. The remaining polymer causes a defect in a later process to reduce yield of the semiconductor device.

As methods for finishing the metal line to remove erosion and polymer, there are provided a method for washing the metal line using deionized water, a method for evaporating the metal line using an annealing process, and a method for finishing the metal line using plasma containing fluorine (F).

However, the method for washing the metal line using deionized water has drawbacks in that it fails to perfectly remove the polymer and prevent the aluminum line from being eroded for the long run. The method for evaporating the metal line using an annealing process has drawbacks in that it causes hillock, segregation, and recrystallization if an annealing temperature exceeds 300° C. due to a low melting point of aluminum.

The method for finishing the metal line using plasma containing fluorine, as disclosed in the Korean Laid-Open Patent No. 2000-0027241, is to remove polymer and photoresist remaining after etching polymer using an etching gas containing fluorine, using an ashing process. However, as shown in FIG. 1C, such a finishing process has problems in that undercut 114 of a barrier film of TiN or TiW is caused by fluorine plasma, excessive loss of a lower oxide film is caused, and aluminum is transformed into $AlF_3$ to remarkably reduce reliability of the semiconductor device.

In a more improved process for manufacturing a semiconductor device, to prevent chlorine and $H_2O$ exposed to the air from being reacted with each other, an etching equipment is provided with an ashing chamber to perform a strip process of photoresist in-situ. Hydrogen chloride is formed using $H_2O$ plasma before polymer is removed using plasma containing fluorine and then exhausted by pumping to remove polymer or a chlorine radical remaining on the surface of aluminum. However, since plasma containing fluorine is used, there still exist the aforementioned problems.

SUMMARY OF THE INVENTION

Accordingly, the present invention is directed to a method for finishing a metal line for a semiconductor device that substantially obviates one or more problems due to limitations and disadvantages of the related art.

An object of the present invention is to provide a method for finishing a metal line for a semiconductor device in which after a chlorine radical remaining on a polymer and a surface of a metal film are removed using $H_2O$ plasma, the polymer is effectively removed using $H_2O$ gas and HF gas, and undercut of a barrier metal film, attack of an oxide film and distortion of the metal film are avoided to improve reliability and yield of the semiconductor device.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for finishing a metal line for a semiconductor device includes the steps of a) patterning a metal film remaining below a photoresist of a predetermined pattern, b) removing a chlorine radical on a surface of the patterned metal film using $H_2O$ plasma, c) stripping the photoresist, and d) removing polymer generating when pattering the metal film, using $H_2O$ gas and HF gas.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

FIG. 2A to FIG. 2D are sectional views illustrating a method for finishing a metal line for a semiconductor device according to the present invention, and Table 1 shows process conditions of an ashing chamber (or photoresist strip chamber) for finishing the metal line for the semiconductor device.

TABLE 1

|  | Pressure (Torr) | Power (W) | Flow rate (sccm) | Time (sec.) | Temperature (° C.) |
| --- | --- | --- | --- | --- | --- |
| First step | 0.5 | 500 | 500 ($H_2O$) | 15 | 300 |
| Second step | 1 | 1200 | 3500 ($O_2$) | 50 | 0 |
| Third step | 0.5 | 0 | 1000 ($H_2O$) | 5 | 300 |
| Fourth step | 0.5 | 0 | 1000 ($H_2O$) 10 (HF) | 30 | 300 |

Figure 1A:
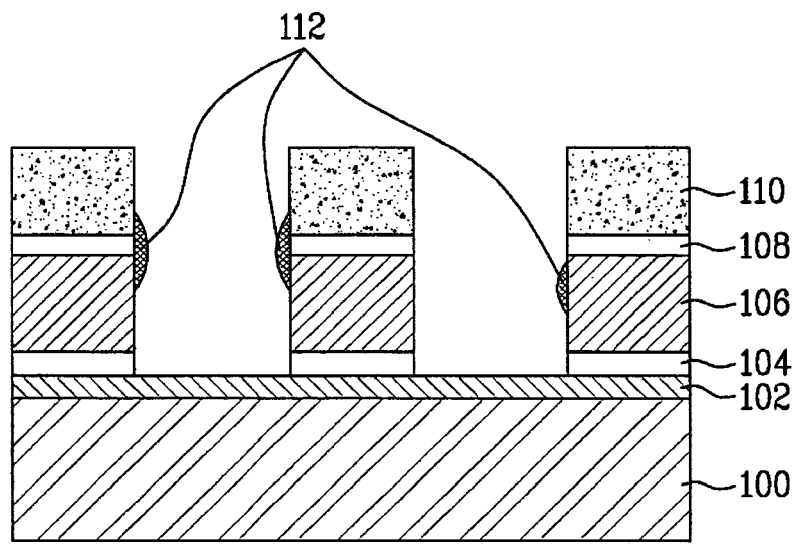
FIG. 1A to FIG. 1C are sectional views illustrating a related art method for finishing a metal line for a semiconductor device.
Figure 1B:
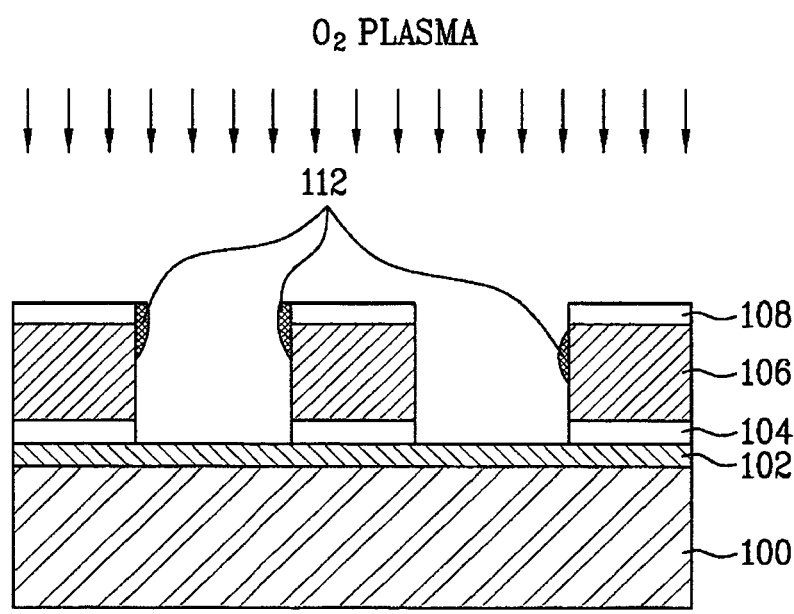
Figure 1C:
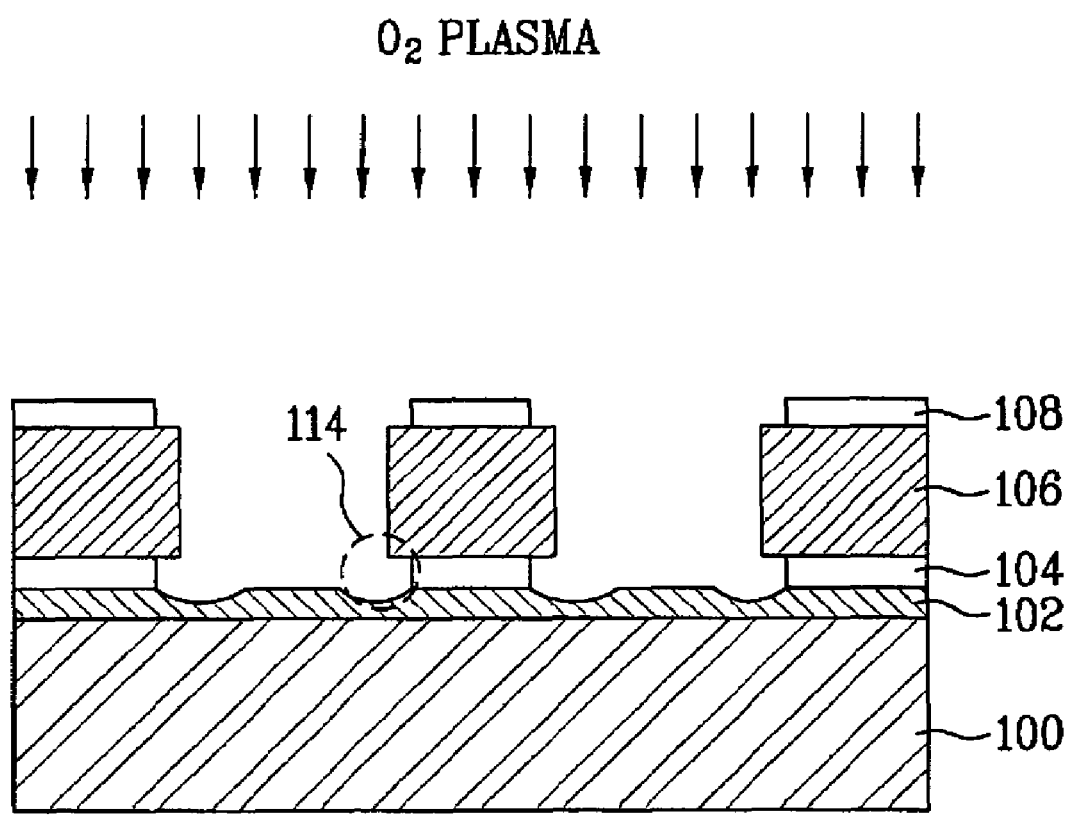
Figure 2A:
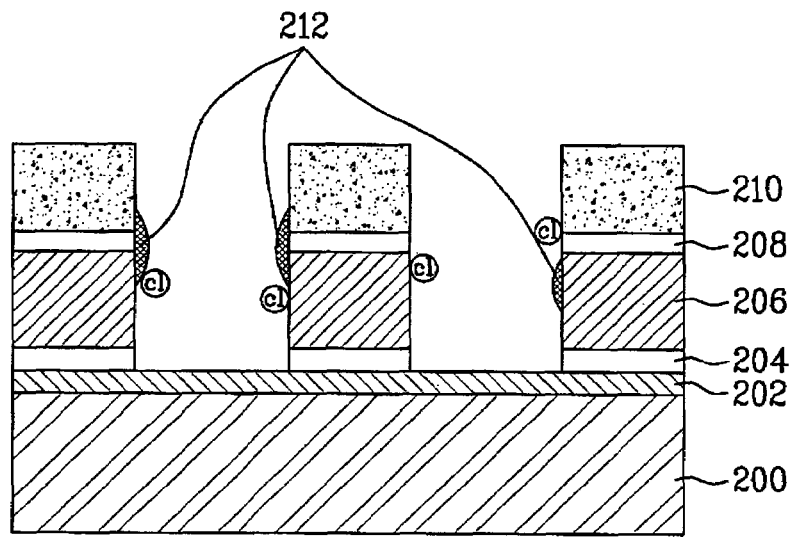
FIG. 2A to FIG. 2D are sectional views illustrating a method for finishing a metal line for a semiconductor device according to the present invention.

First, as shown in FIG. 2A, a photoresist 210 is coated on a substrate 200 on which an oxide film 202, a barrier film 204, a metal film 206 and an antireflective coating film 208 are sequentially formed. The photoresist 210 is then patterned so that the metal film 206 is dry-etched by plasma (for example, $Cl_2$, $BCl_3$) including chlorine. The metal film is preferably formed of a single layered film or a multi-layered film of. However, the metal film is not limited to the above case but formed of every metal dry-etched using plasma including chlorine.

Since a melting point of aluminum is low within the range of about 660° C., aluminum is moved well by electron mobility. Therefore, aluminum is susceptible to electromigration (EM). To prevent such EM, a barrier film 204 of Ti, TiN, W, or TiW is formed below the metal film of aluminum. The antireflective coating film 208 is formed on the metal film 206. If the metal film 206 is of aluminum, it is possible to prevent hillock, EM and stress migration (SM) from being formed, thereby improving reliability of the metal line. The barrier film 204 and the antireflective coating film 208 are not necessarily required.

When the metal film 206 is etched, chlorine is reacted with aluminum and the photoresist to form polymer 212 containing chlorine. The polymer 112 is coated on a surface of the metal film 206. Also, a chlorine radical or a chlorine compound may be coated on the surface of the metal film 206.

Figure 2B:
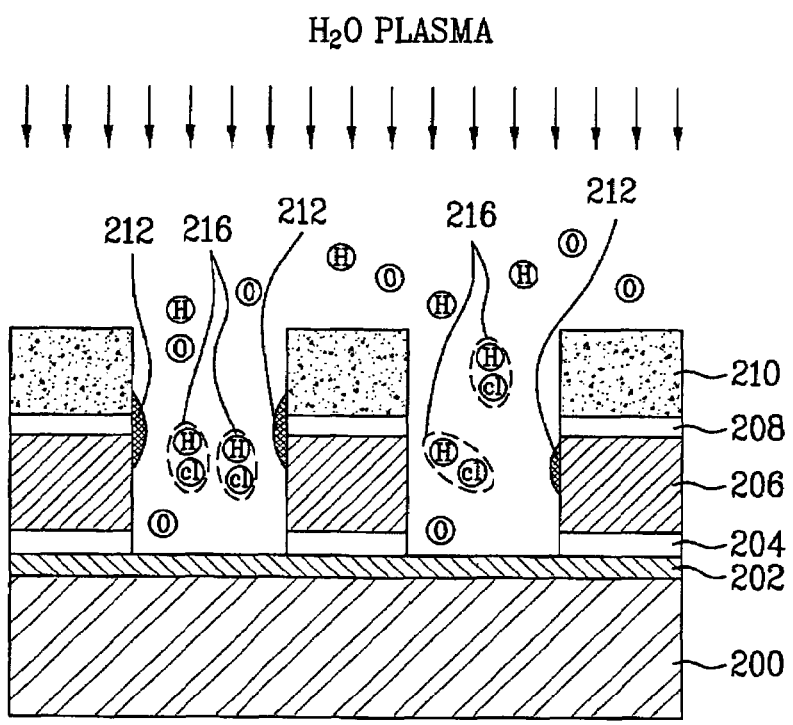

Next, as shown in FIG. 2B, the chlorine radical remaining on the surface of the polymer 212 and the metal film 206 is transformed into hydrogen chloride 216 using $H_2O$ plasma and then removed (first step of Table 1). By removing the chlorine radical, hydrogen chlorine is formed when the metal film 206 is exposed to the air, so that the metal film 206 is prevented from being eroded, and a thin oxide film is formed on the surface of the metal film 206 to protect the metal film 206.

The conditions of the ashing chamber for formation of $H_2O$ plasma are preferably set in such a manner as pressure of 0.4 Torr to 0.6 Torr, power of 400 W to 600 W, flow rate of 400 sccm to 600 sccm, time of 10 sec. to 20 sec., and temperature of 300° C. or below. More preferably, the process conditions shown in the first step of Table 1 are used.

Figure 2C:
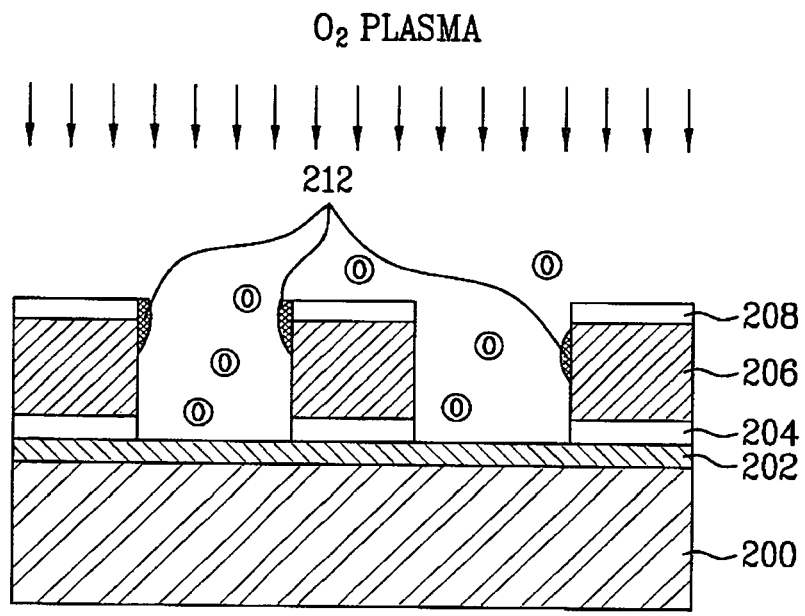

Subsequently, as shown in FIG. 2C, a strip process is performed to remove the photoresist 210 using $O_2$ plasma (second step of Table 2). When the photoresist 210 is removed, polymer is partially removed but remains on the surface of the metal film 206.

The conditions of the ashing chamber for formation of $O_2$ plasma are preferably set in such a manner as pressure of 0.8 Torr to 1.2 Torr, power of 1000 W to 1500 W, flow rate of 3000 sccm to 4000 sccm, time of 40 sec. to 60 sec., and room temperature or below. More preferably, the process conditions shown in the second step of Table 1 are used.

Afterwards, instead of high frequency power applied to anode and cathode in the chamber, $H_2O$ gas flows thereinto (third step of Table 1). This is to prevent the metal film from being attacked by HF in the following fourth step of Table 1.

The conditions of $H_2O$ gas are preferably set in such a manner as pressure of 0.4 Torr to 0.6 Torr, power of 0 W, flow rate of 800 sccm to 1200 sccm, time of 10 sec. or below, temperature of 300° C. or below. More preferably, the process conditions shown in third step of Table 1 are used.

Figure 2D:
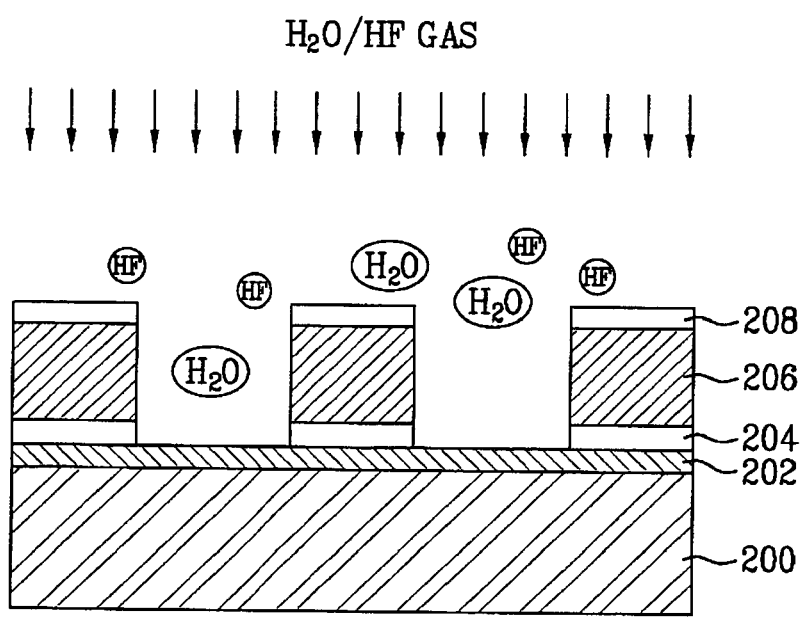

Next, as shown in FIG. 2D, $H_2O$ gas and HF gas flow in a state that there is no power, so that the polymer 212 is removed (fourth step of Table 1).

The conditions of removing polymer using $H_2O$ gas and HF gas are preferably set in such a manner as pressure of 0.4 Torr to 0.6 Torr, power of 0 W, $H_2O$ flow rate of 800 sccm to 1200 sccm, HF flow rate of 10 sccm, time of 50 sec. or below, temperature of 300° C. or below. More preferably, the process conditions shown in fourth step of Table 1 are used. Flow rate ratio between $H_2O$ and HF is set as 80:1, more preferably 100:1 or above.

As described above, the polymer can effectively be removed using $H_2O$ and HF not plasma and undercut of the barrier film and attack of the oxide film can be prevented from being caused. Also, device characteristics can be prevented from being degraded by reaction between fluorine and metal film.

The aforementioned process of the present invention, as shown in Table 1, includes the series of steps of patterning a metal film remaining below a photoresist of a predetermined pattern, removing the chlorine radical on the metal film using $H_2O$, stripping the photoresist using $O_2$, depositing $H_2O$ gas, and removing polymer using $H_2O$ gas and HF gas. The second step of Table 1 may be performed after the fourth step of Table 1. That is, the process of the present invention may include the series steps of patterning a metal film remaining below a photoresist of a predetermined pattern, removing the chlorine radical on the metal film using $H_2O$, depositing $H_2O$ gas, removing polymer using $H_2O$ gas and HF gas, and stripping the photoresist using $O_2$.

As described above, the method for finishing a metal line for a semiconductor device according to the present invention has the following advantages.

The chlorine radical and the chlorine compound generated when forming the metal line for the semiconductor device including aluminum and its alloy are removed using $H_2O$ plasma, and the polymer generated when patterning the metal line is effectively removed using $H_2O$ gas and HF gas not plasma. In addition, since undercut of the barrier metal film, attack of the oxide film and distortion of the metal film are avoided, it is possible to improve reliability and yield of the semiconductor device.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for post-treating a metal line for a semiconductor device, comprising:
    forming a metal film on a substrate;
    forming a photoresist pattern over the metal film;
    patterning by etching the metal film by a plasma including chlorine using the photoresist pattern as a mask;
    removing a chlorine radical on a surface of the patterned metal film using an $H_2O$ plasma;
    stripping the photoresist pattern using an $O_2$ plasma;
    flowing an $H_2O$ gas into a chamber containing the substrate at a power of 0 W and a flow rate of 800 sccm to 1200 sccm; and
    removing a polymer generated when etching the metal film, using the $H_2O$ gas and hydrogen fluoride (HF) gas in the chamber at the power of 0 W.

2. The method of claim 1, wherein the chamber containing the $H_2O$ plasma has conditions including a pressure of 0.4 Torr to 0.6 Torr, a power of 400 W to 600 W, an $H_2O$ flow rate of 400 sccm to 600 sccm, and a temperature of 300° C. or below.

3. The method of claim 1, wherein the conditions of flowing $H_2O$ gas further include a pressure of 0.4 Torr to 0.6 Torr, a time of 10 sec. or below, and a temperature of 300° C. or below.

4. The method of claim 1, wherein the chamber containing the $O_2$ plasma has conditions including a pressure of 0.8 Torr to 1.2 Torr, a power of 1000 W to 1500 W, an $O_2$ flow rate of 3000 sccm to 4000 sccm, and a temperature of room temperature or below.

5. The method of claim 1, wherein a flow rate ratio of the $H_2O$ gas to the HF gas is 80:1 or above.

6. The method of claim 1, wherein the $H_2O$ gas and the HF gas have a total flow rate of 800 sccm to 1200 sccm.

7. The method of claim 1, wherein the metal film includes an aluminum film or an aluminum alloy.

8. The method of claim 1, wherein etching the metal film comprises dry-etching, and the plasma comprises $Cl_2$ or $BCl_3$.

9. The method of claim 1, wherein removing the chlorine radical is performed for a length of time of from 40 sec. to 60 sec.

10. The method of claim 1, wherein removing the polymer is performed for a length of time of from 50 sec. or below.

11. The method of claim 10, wherein removing the polymer is performed under conditions further including a pressure of 0.4 Torr to 0.6 Torr, an $H_2O$ flow rate of 800 sccm to 1200 sccm, and a temperature of 300° C. or below.

12. The method of claim 11, wherein removing the polymer is performed under conditions further including an HF flow rate of 10 sccm.

13. The method of claim 1, wherein removing the polymer is performed for a length of time of at least 30 sec.

14. The method of claim 1, wherein flowing the the $H_2O$ gas is performed for a length of time of at least 5 sec.

15. A method for post-treating a metal line for a semiconductor device, comprising:
    sequentially forming a barrier film, a metal film and an antireflective coating film on a substrate;
    forming a photoresist pattern over the metal film;
    patterning by etching the barrier film, the metal film and the antireflective coating film by a plasma including chlorine using the photoresist pattern as a mask;
    removing a chlorine radical on a surface of the patterned metal film using an $H_2O$ plasma;
    stripping the photoresist pattern using an $O_2$ plasma;
    flowing an $H_2O$ gas into a chamber containing the substrate at a power of 0 W and a flow rate of 800 sccm to 1200 sccm; and
    removing a polymer generated when etching the metal film, using the $H_2O$ gas and hydrogen fluoride (HF) gas in the chamber at the power of 0 W.

16. The method of claim 15, wherein the chamber containing the $H_2O$ plasma has conditions including a pressure of 0.4 Torr to 0.6 Torr, a power of 400 W to 600 W, an $H_2O$ flow rate of 400 sccm to 600 sccm, and a temperature of 300° C. or below.

17. The method of claim 15, wherein the conditions of flowing $H_2O$ gas further include a pressure of 0.4 Torr to 0.6 Torr, a time of 10 sec. or below, and a temperature of 300° C. or below.

18. The method of claim 15, wherein the chamber containing the $O_2$ plasma has conditions including a pressure of 0.8 Torr to 1.2 Torr, a power of 1000 W to 1500 W, an $O_2$ flow rate of 3000 sccm to 4000 sccm, and a temperature of room temperature or below.

19. The method of claim 15, wherein a flow rate ratio of the $H_2O$ gas to the HF gas is 80:1 or above.

20. The method of claim 15, wherein the $H_2O$ gas and the HF gas have a total flow rate of 800 sccm to 1200 sccm.

21. The method of claim 15, wherein the metal film includes an aluminum film or an aluminum alloy.

22. The method of claim 15, wherein etching the metal film comprises dry-etching, and the plasma comprises $Cl_2$ or $BCl_3$.

23. The method of claim 15, wherein removing the chlorine radical is performed for a length of time of from 40 sec. to 60 sec.

24. The method of claim 15, wherein removing the polymer is performed for a length of time of from 50 sec. or below.

25. The method of claim 24, wherein removing the polymer is performed under conditions further including a pressure of 0.4 Torr to 0.6 Torr, an $H_2O$ flow rate of 800 sccm to 1200 sccm, and a temperature of 300° C. or below.

26. The method of claim 25, wherein removing the polymer is performed under conditions further including an HF flow rate of 10 sccm.

27. The method of claim 15, wherein removing the polymer is performed for a length of time of at least 30 sec.

28. The method of claim 15, wherein flowing the the $H_2O$ gas is performed for a length of time of at least 5 sec.

* * * * *